United States Patent
Choppalli et al.

(10) Patent No.: US 10,032,761 B1
(45) Date of Patent: Jul. 24, 2018

(54) ELECTRONIC DEVICES WITH TUNABLE ELECTROSTATIC DISCHARGE PROTECTION AND METHODS FOR PRODUCING THE SAME

(71) Applicant: Globalfoundries Singapore Pte. Ltd., Singapore (SG)

(72) Inventors: Vvss Satyasuresh Choppalli, Singapore (SG); Vaddagere Nagaraju Vasantha Kumar, Singapore (SG); Tsung-Che Tsai, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/481,835

(22) Filed: Apr. 7, 2017

(51) Int. Cl.
| | |
|---|---|
| H01L 23/62 | (2006.01) |
| H01L 29/66 | (2006.01) |
| H01L 27/02 | (2006.01) |
| H01L 27/088 | (2006.01) |
| H01L 29/423 | (2006.01) |
| H01L 29/10 | (2006.01) |
| H01L 23/528 | (2006.01) |
| H01L 21/8234 | (2006.01) |
| H01L 21/02 | (2006.01) |

(52) U.S. Cl.
CPC ...... H01L 27/0248 (2013.01); H01L 21/0251 (2013.01); H01L 21/823456 (2013.01); H01L 21/823475 (2013.01); H01L 21/823493 (2013.01); H01L 23/528 (2013.01); H01L 27/088 (2013.01); H01L 29/1083 (2013.01); H01L 29/1087 (2013.01); H01L 29/42376 (2013.01)

(58) Field of Classification Search
CPC ............. H01L 27/0248; H01L 27/0251; H01L 27/066
USPC .......................................... 257/173, 355, 357
See application file for complete search history.

(56) References Cited

U.S. PATENT DOCUMENTS

| | | | |
|---|---|---|---|
| 5,559,352 A | 9/1996 | Hsue et al. | |
| 5,870,268 A | 2/1999 | Lin et al. | |
| 5,953,601 A | 9/1999 | Shiue et al. | |
| 7,408,754 B1 * | 8/2008 | O | H01L 27/0262 361/91.1 |
| 7,714,356 B2 | 5/2010 | Abou-Khalil et al. | |
| 2004/0164354 A1 * | 8/2004 | Mergens | H01L 27/0277 257/355 |
| 2008/0259511 A1 * | 10/2008 | Worley | H01L 27/0266 361/56 |
| 2010/0027173 A1 | 2/2010 | Wijmeersch | |

(Continued)

*Primary Examiner* — David Vu
*Assistant Examiner* — Brandon Fox
(74) *Attorney, Agent, or Firm* — Lorenz & Kopf, LLP

(57) ABSTRACT

Electronic devices and methods of producing such electronic devices are provided. In an exemplary embodiment, a method of producing an electronic device includes forming a protected circuit and an ESD circuit, where the ESD circuit is configured to discharge an electrostatic discharge (ESD) to a ground such that the ESD bypasses the protected circuit. An ESD transistor is formed in the ESD circuit, where the ESD transistor includes a source and a drain. The ESD transistor also includes a gate with a gate width perpendicular to a gate length, where the gate length is measured across the gate from the source to the drain. A trigger voltage of the ESD transistor is set by adjusting the gate width.

18 Claims, 8 Drawing Sheets

(56) References Cited

U.S. PATENT DOCUMENTS

2011/0310514 A1* 12/2011 Huang .................. H01L 27/027
　　　　　　　　　　　　　　　　　　　　　　　361/56

* cited by examiner

ELECTRONIC DEVICES WITH TUNABLE ELECTROSTATIC DISCHARGE PROTECTION AND METHODS FOR PRODUCING THE SAME

TECHNICAL FIELD

The technical field generally relates to electronic devices tunable electrostatic discharge protection and methods of producing the same, and more particularly relates to electronic devices with an electrostatic discharge transistor having an adjustable trigger voltage and methods of producing the same.

BACKGROUND

Many electronic devices are sensitive to electrostatic discharge (ESD) and other forms of voltage spikes. An ESD event is a sudden flow of electricity between two or more objects. The electrical flow can be initiated in several ways, such as electrical contact, human contact, or an accidental discharge during manufacturing or assembly. The static electricity developed by walking across a carpet can be enough to damage some devices, where static electricity often has very high voltage. In many cases, an ESD event will damage or destroy one or more electronic components in an electronic device, and ESD events are common.

Various techniques are used to prevent electronic device damage due to ESD events. For example, manufacturers may utilize electrostatic protective environments that are essentially free of static electricity. This can involve several measures, such as avoiding the use of highly charging materials, grounding objects and/or workers, and controlling humidity. Many electronic devices are transported in special containers that help prevent damage from ESD events, such as anti-static bags that include partially conductive plastics or other conductive materials. However, it may be difficult or impossible to prevent ESD events for electronic devices in use. For example, an electronic device included in a motor vehicle or a hand held device is exposed to many different conditions, so prevention of ESD events is difficult. Some electronic devices include design features to protect electronic components, but such protection has limits. On-chip ESD discharges can also damage discrete components, and other types of ESD protection are more appropriate for on-chip ESD discharges.

Some electronic devices include two or more protected circuits that operate at different voltages, so the electrostatic discharge protection measures are typically designed for different trigger voltages appropriate for the operating voltage. A "protected circuit" is a circuit or sub-circuit of the electronic device that has an ESD circuit for protecting the "protected circuit" from an ESD event. Integrated circuits are used for a wide variety of uses, and many of those uses demand the integrated circuit include components that operate at different voltages, with some components operating at relatively low voltages, others at medium voltages, and still others at higher voltage. The electrostatic discharge protection measures are often individually designed for protected circuits operating at different voltages, so protected circuits operating at each operating voltage may have an electrostatic discharge protection device with a different design. The design of multiple different electrostatic discharge protection devices requires more input than the design of a single type of electrostatic discharge protection device, and the use of several different types of electrostatic discharge protection devices in a single electronic device may require additional manufacturing steps for some of the ESD circuits but not for others. Additional manufacturing steps generally increase the cost of an electronic device.

Accordingly, it is desirable to provide electronic devices with an electrostatic discharge protection device with a trigger voltage that can be adjusted with a minor change in the ESD protection device, and methods of producing the same. In addition, it is desirable to provide electronic devices with ESD protection devices having a rapid trigger response time and a high current capacity, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Electronic devices and methods of producing such electronic devices are provided. In an exemplary embodiment, a method of producing an electronic device includes forming a protected circuit and an ESD circuit, where the ESD circuit is configured to discharge an electrostatic discharge (ESD) to a ground such that the ESD bypasses the protected circuit. An ESD transistor is formed in the ESD circuit, where the ESD transistor includes a source and a drain. The ESD transistor also includes a gate with a gate width perpendicular to a gate length, where the gate length is measured across the gate from the source to the drain. A trigger voltage of the ESD transistor is set by adjusting the gate width.

A method of producing an electronic device is provided in another embodiment. The method includes forming an ESD transistor with a source, a drain, and a gate between the source and drain. A P well is formed underlying the source, the drain, and the gate, and a deep N well is formed underlying the P well. A source interconnect is formed, where the source interconnect is in electrical communication with the source, the P well, and the gate. A drain interconnect is formed in electrical communication with the drain and the deep N well.

An electronic device is provided in yet another embodiment. The electronic device includes a first protected circuit and a second protected circuit. A first ESD circuit is configured to discharge an ESD to a ground to bypass the first protected circuit, where the first ESD circuit includes a first ESD transistor. The first ESD transistor has a first gate width and a first trigger voltage. A second ESD circuit is configured to discharge the ESD to the ground to bypass the second protected circuit, where the second ESD circuit includes a second ESD transistor. The second ESD transistor has a second gate width that is different than the first gate width, and the first and second ESD transistors include comparable components that are comparably configured with the exception that the first and second gate widths are different. The second ESD transistor has a second trigger voltage that is different than the first ESD transistor.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to electronic devices and methods for fabricating the same. The various tasks and process steps described herein may be incorporated into a more comprehensive procedure or process having additional steps or functionality not described in detail herein. In particular, various steps in the manufacture of electronic devices are well-known and so, in the interest of brevity, many conventional steps will only be mentioned briefly herein or will be omitted entirely without providing the well-known process details.

An ESD transistor has a trigger voltage, where electrical current flows across the ESD transistor when the voltage drop across the ESD transistor about reaches or exceeds the trigger voltage. An ESD transistor is described below where the trigger voltage can be adjusted by modifying a gate width on the ESD transistor. As such, a common ESD transistor design may be used and adjusted for a range of trigger voltages that are appropriate to provide ESD protection for different protected circuits in a single electronic device that have different operating voltages.

Figure 1:
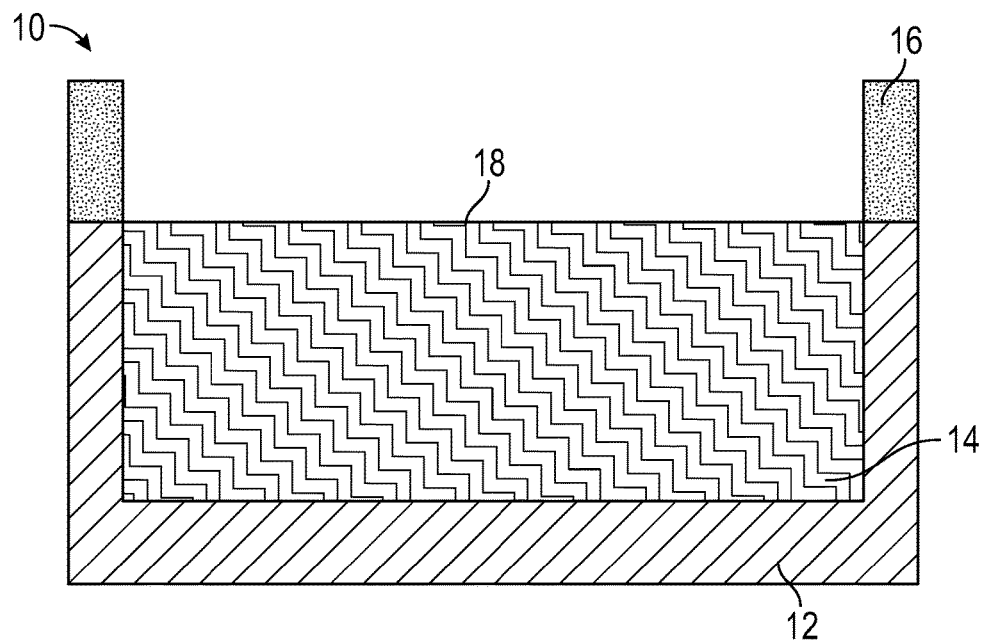
FIGS. 1-7 illustrate, in cross sectional views, an electronic device and methods for fabricating the same in accordance with exemplary embodiments.

Referring to FIG. 1, an exemplary process for producing the ESD transistor within an electronic device 10 includes forming a deep N well 14 in a substrate 12, the substrate 12 includes semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, and the like. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

In an exemplary embodiment, the substrate 12 is monocrystalline silicon that includes conductivity determining impurities (i.e., "dopants.") In this exemplary embodiment the substrate 12 conductivity determining impurities that are primarily "P" type conductivity determining impurities. "P" type conductivity determining impurities include boron, aluminum, gallium, and indium, but other materials or combinations of materials can also be used, and different components may be implanted with the same or different "P" type conductivity determining impurities in various embodiments. "N" type conductivity determining impurities include arsenic or phosphorous, but antimony, other materials, or combinations thereof can also be used, and different components may be implanted with the same or different "N" type conductivity determining impurities in various embodiments.

A deep N well photoresist layer 16 is formed and patterned overlying the substrate 12 to expose an area of the substrate 12. As used herein, the term "overlying" means "over" such that an intervening layer may lie between the deep N well photoresist layer 16 and the substrate 12, or "on" such that the deep N well photoresist layer 16 physically contacts the substrate 12. Moreover, the term "directly overlying" means a vertical line passing through the upper component also passes through the lower component, such that at least a portion of the upper component is directly over at least a portion of the lower component. It is understood that the electronic device 10 may be moved such that the relative "up" and "down" positions change, so reference to a "vertical" line means a line that is about perpendicular to a substrate top surface 18.

The deep N well photoresist layer 16 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the deep N well photoresist layer 16 remains overlying the other areas of the substrate 12. The deep N well photoresist layer 16 (and other photoresist layers described below) may optionally include a top and/or bottom anti-reflective coating (not illustrated) and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. The hard mask (not illustrated) (and other hard masks associated with other photoresist layer described below) may include silicon nitride, where silicon nitride can be formed by low pressure chemical vapor deposition using ammonia and dichlorosilane. Other materials or formation techniques may be used for a hard mask in alternate embodiments. Portions of the hard mask are exposed by removal of selected portions of the deep N well photoresist layer 16. The exposed portions of the hard mask may then be removed with a wet etch using hot phosphoric acid in some embodiments. The deep N well photoresist layer 16 (and other photoresist layers described below) may be removed after use, such as with an oxygen containing plasma.

The deep N well 14 is implanted into the substrate 12, and in an exemplary embodiment the deep N well 14 includes the material of the substrate 12 and conductivity determining impurities that are primarily "N" type conductivity determining impurities. The term "deep N well" 14, as used herein, includes the structure typically referred to as a deep N well in the semiconductor industry, but also includes other similar structures that may be described in the industry such as high voltage N wells, medium voltage N wells, and other similar structures that include conductivity determining impurities that are primarily "N" type within the substrate 12. The conductivity determining impurities may be implanted in a variety of manners. Thermal diffusion or ion implantation may be used in some embodiments. In an exemplary embodiment, ions of the conductivity determining impurity are implanted into the substrate 12 under the influence of an electrical field in ion implantation. The depth of the implantation is adjusted by the strength of the electrical field, so the deep N well 14 can be formed at a desired depth within the substrate 12. In an exemplary embodiment, the deep N well 14 is from about 1.5 micrometers (μm) to about 5 μm or more from the substrate top surface 18, but other depths and thicknesses are also possible. The deep N well photoresist layer 16 is removed after use.

Figure 2:
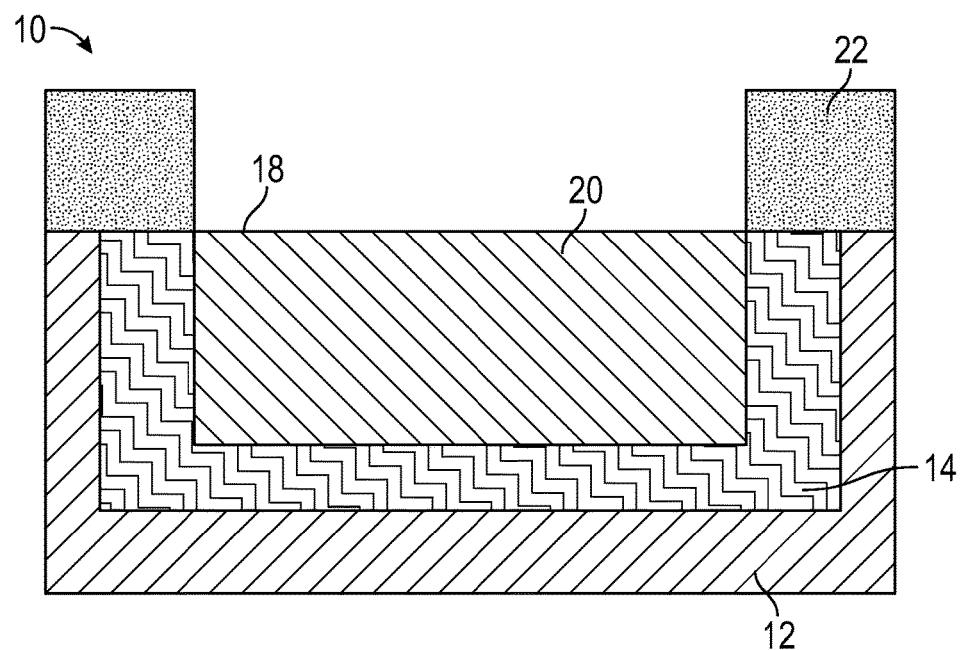

FIG. 2 illustrates an exemplary embodiment where a P well 20 is formed within the deep N well 14 such that the P well 20 overlies at least a portion of the deep N well 14. The P well 20 may be positioned with a P well photoresist layer 22, where the P well photoresist layer 22 is patterned as described above. The P well 20 includes conductivity determining impurities that are primarily "P" type conductivity determining impurities, and the P well 20 overlies the portion of the substrate 12 that underlies the deep N well 14. The P well 20 extends from a top of the deep N well 14 to the substrate top surface 18, and the deep N well 14 may extend beyond the P well 20 laterally, or parallel with the substrate top surface 18. Reference to the "substrate 12" herein indicates the portion of the substrate 12 that has not been converted to the deep N well 14, the P well 18, or any other component, so reference to the substrate 12 indicates the substrate 12, possibly with an initial concentration of conductivity determining impurities, but prior to any conductivity determining implantations as described herein.

Figure 3:
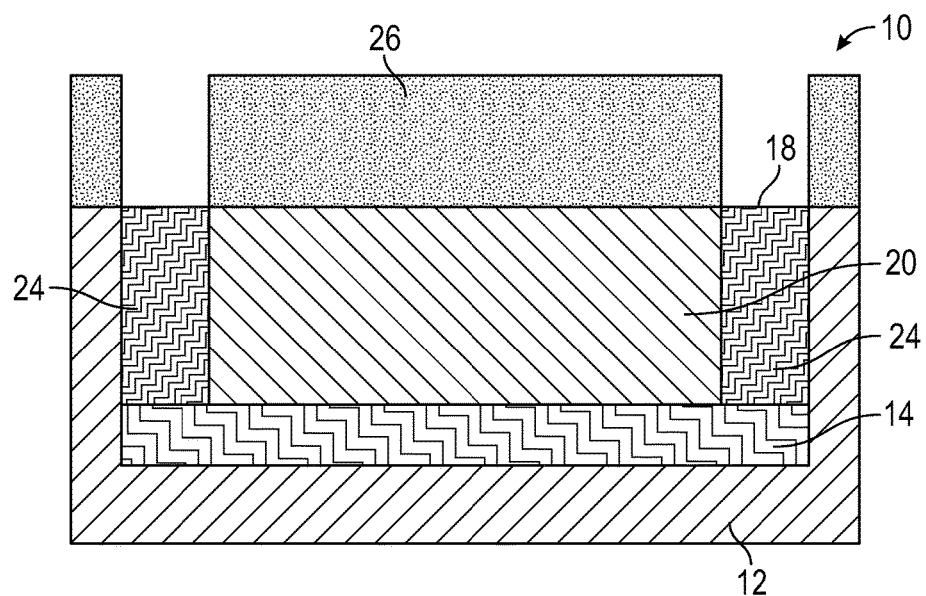

Reference is made to FIG. 3. A connecting well 24 is formed in the substrate 12 in an exemplary embodiment, where the connecting well 24 includes conductivity determining impurities that are primarily "N" type. As such, the connecting well 24 and the deep N well 14 include the same type of conductivity determining impurity. The connecting well 24 extends to the deep N well 14 and is adjacent to the P well 20 in an exemplary embodiment, so the connecting well 24 is in electrical communication with the both the deep N well 14 and the P well 20. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductors, but not electrical insulators. As used herein, an "electrically insulating material" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from about more than $1 \times 10^{-4}$ ohm meters to less than about $1 \times 10^4$ ohm meters. In the illustrated embodiment, the connecting well 24 is in direct electrical contact with both the deep N well 14 and the P well 20. A connecting well photoresist layer 26 is formed and patterned overlying the substrate 12 to position the connecting well 24 in an exemplary embodiment.

Figure 4:
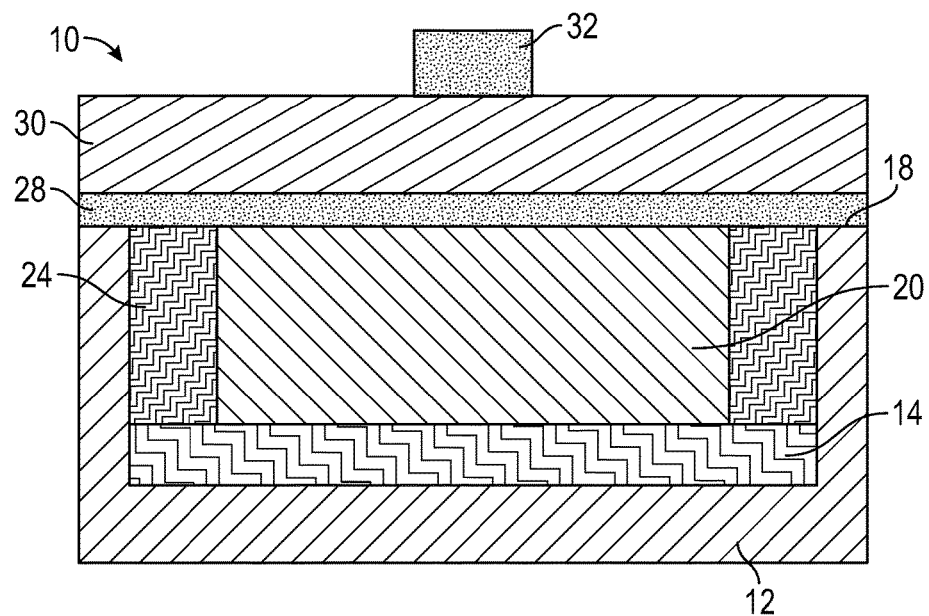

Referring to an exemplary embodiment in FIG. 4, a gate insulator layer 28 is formed overlying the substrate top surface 18 and a gate layer 30 is formed overlying the gate insulator layer 28. The gate insulator layer 28 is an electrical insulator, such as silicon dioxide or high K dielectrics, and the gate layer is an electrical conductor, such as polysilicon with conductivity determining impurities or certain metals. Other materials may also be used in various embodiments. Silicon dioxide can be formed by exposing monocrystalline silicon to an oxidizing ambient at elevated temperatures, such as from about 900 to about 1,200 degrees Celsius (° C.), and polysilicon can be formed by low pressure chemical vapor deposition in a silane environment, but other techniques are also available. A gate photoresist layer 32 is formed and patterned overlying the gate layer 30 in an exemplary embodiment.

Figure 5:
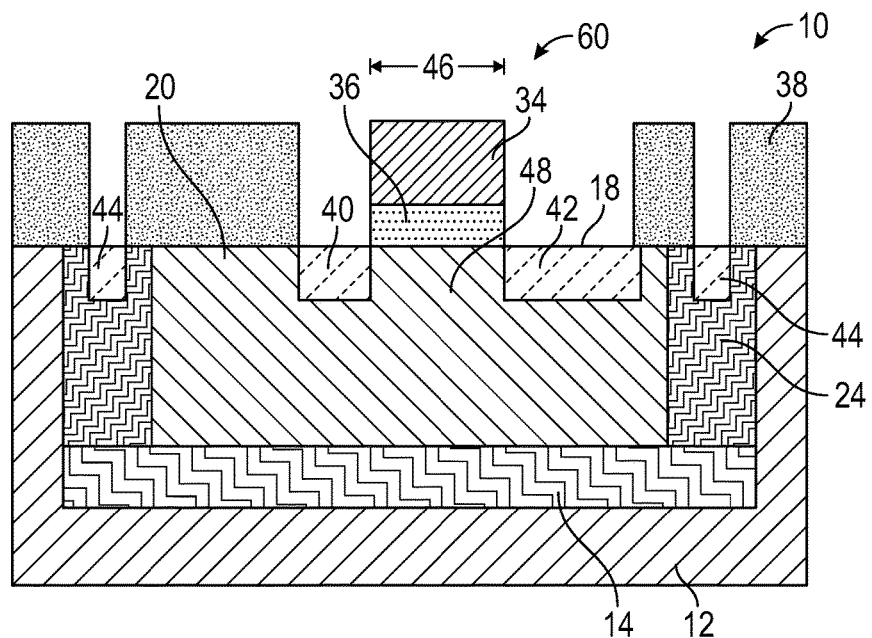

Reference is made to the exemplary embodiment illustrated in FIG. 5, with continuing reference to FIG. 4. A gate 34 is formed overlying a gate insulator 36 by removing the gate layer 30 and the gate insulator layer 28 from over the substrate 12 except where protected by the gate photoresist layer 32. In an embodiment where the gate layer 32 primarily includes polysilicon, the gate layer 32 can be removed with a reactive ion etch using hydrogen bromide, but other etch techniques or etchants are used in alternate embodiments. In an exemplary embodiment with a silicon dioxide gate insulator layer 28, the gate insulator layer 28 is removed with a wet etch including dilute hydrofluoric acid, but other etchants or etch techniques can also be used. A source/drain photoresist layer 38 is formed and patterned overlying the substrate top surface 18, and "N" type conductivity determining ions are implanted to form a source 40, a drain 42, and an N connection point 44. The source 40 and drain 42 are positioned within the P well 20 in an exemplary embodiment, and the N connection point 44 is positioned within the connecting well 24. The source 40 and drain 42 are on opposite sides of the gate 34, and a gate length 46 is defined by the length of the gate 34 along the shortest line directly between the source 40 and drain 42. A channel 48 is defined within the P well 20 directly underlying the gate 34 between the source 40 and the drain 42. An ESD transistor 60 includes the source 40, the drain 42, the gate 34, the gate insulator 36, and the channel 48.

Figure 6:
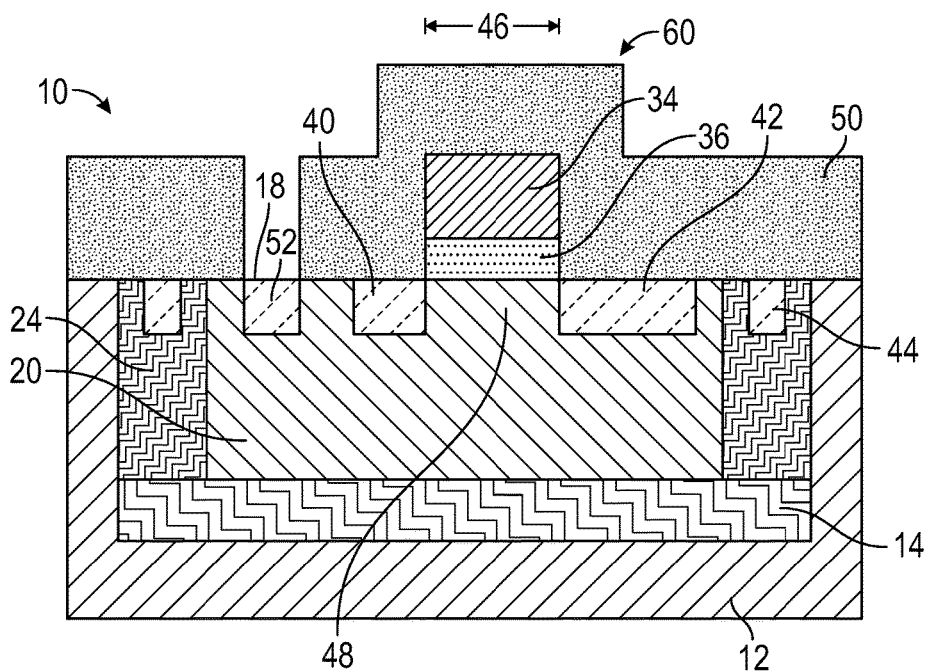

A base contact photoresist layer 50 is formed and patterned overlying the substrate top surface 18, as illustrated in an exemplary embodiment in FIG. 6 with continuing reference to FIG. 5. A base contact 52 is then formed within the P well 20, where the base contact 52 includes conductivity determining impurities that are primarily the "P" type conductivity determining impurities. The concentration of conductivity determining impurities in the base contact 52 is higher than in the P well 20, and both the case contact 52 and the P well 20 have a preponderance of the same type of conductivity determining impurity (the "P" type in the illustrated example.) The base contact 52 is in electrical communication and direct electrical contact with the P well 20.

Figure 7:
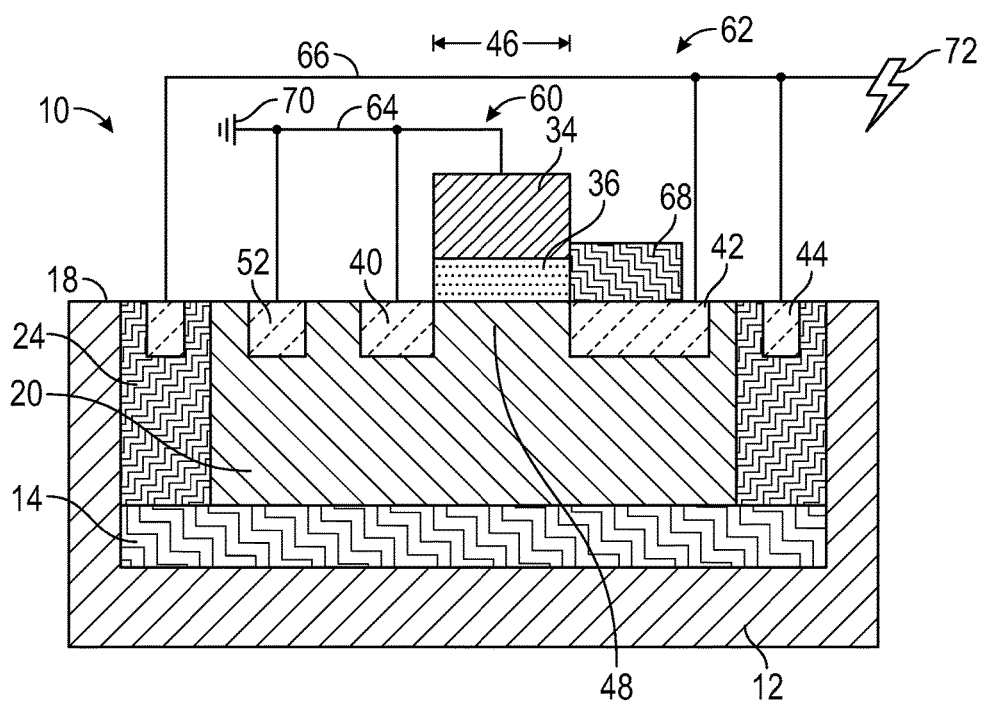

Referring to an exemplary embodiment in FIG. 7, an ESD circuit 62 is formed using known techniques, where the ESD circuit 62 includes the ESD transistor 60, a source interconnect 64, and a drain interconnect 66. The ESD circuit 62 may optionally include a salicide block 68, where the salicide block 68 is an electrical insulator that overlies a portion of the drain 42 and leaves a portion of the drain 42 exposed. The source interconnect 64 is in electrical communication with the gate 34, the source 40, the base contact 52, and a ground 70, so the gate 34, the source 40, the base contact 52, the P well 20 (which is in electrical communication with the base contact 52), and the ground 70 are all in electrical communication. The drain interconnect 66 is in electrical communication with the drain 42, the N connection point 44, the connecting well 24 (which is in electrical communication with the N connection point 44), and the deep N well 14 (which is in electrical communication with the connecting well 24), and an I/O port 72. In an exemplary embodiment, the I/O port 72 is a signal pin, but the I/O port 72 may be other components in alternate embodiments. The ESD circuit 62 may include additional items, such as silicides, diodes, and contacts (not illustrated.) The order of the processes described above may be altered in various embodiments.

Figure 8:
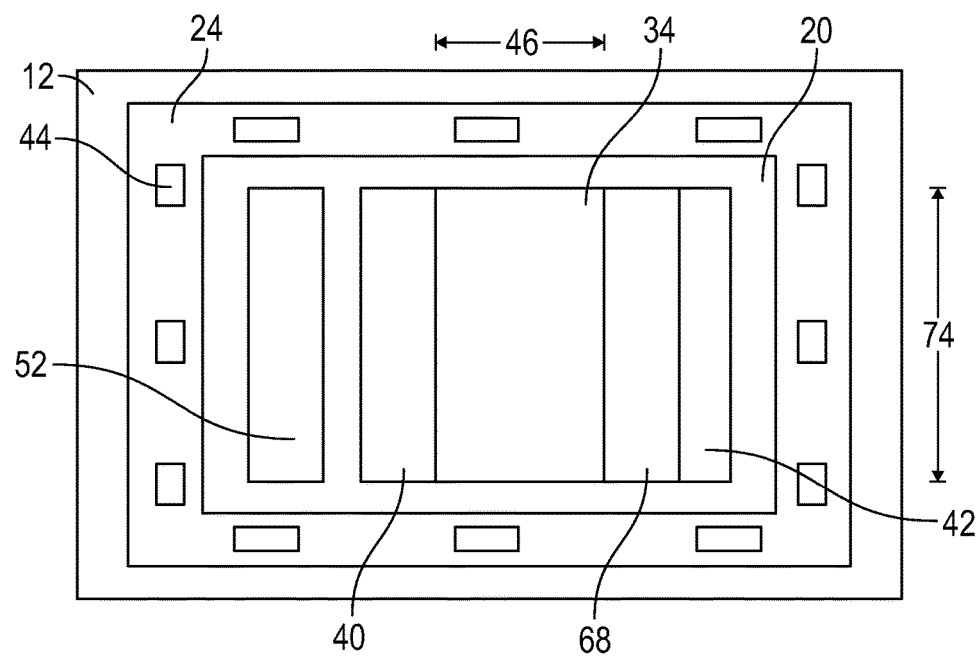
FIG. 8 illustrates a top view of an embodiment of an electronic device.

FIG. 8 illustrates a top view of the ESD transistor 60, where the connecting well 24 forms a ring around the base contact 52, the source 40, the drain 42, and the gate 34. A plurality of N contact points 44 are illustrated in the connecting well 24. The gate 34 has a gate width 74 that is perpendicular to the gate length 46, where the gate width 74 is the distance of the gate 34 that is directly adjacent to the drain 42. In some embodiments (not illustrated), the gate 34 may extend beyond the drain 42, so the gate width 74 would not include the length of the gate 34 that extends beyond the drain 42. The gate width 74 is not shorter than the gate 34 (obviously), so if the drain 42 extended beyond the gate 34 (not illustrated), the gate width 74 would not include the length of the drain 42 extending beyond the gate 34.

The ESD transistor 60 and the ESD circuit 62 provide very rapid response. Current can enter the P well 20 through the drain 42, but also through the connecting well 24 and through the deep N well 14 because the connecting well 24 and the deep N well 14 are in electrical communication with the drain 42. The current can exit the P well 20 through the source 40 or through the base contact 52, where current flow from the P well 20 to the base contact 52 remains in material with conductivity determining impurities that are primarily the same type, which is the "P" type in this instance. The electrical communication between the drain 42, the connecting well 24, and the deep N well 14 improve the response time of the ESD transistor 60 compared to a similar ESD transistor 60 without a connecting well 24 and therefore without electrical communication between the deep N well 14 and the drain 42. Furthermore, the trigger voltage of the ESD transistor 60 can be adjusted by changing the gate width 74 such that the trigger voltage fits and ESD design window.

Figure 9:
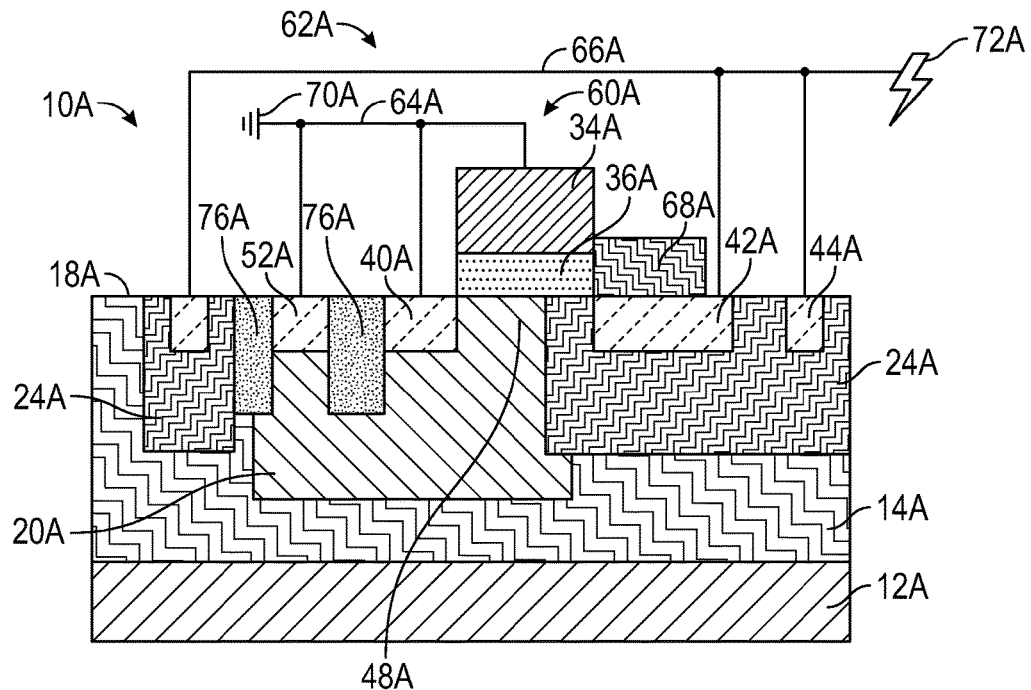
FIGS. 9-11 illustrate, in cross sectional views, alternate embodiments of an electronic device.
Figure 10:
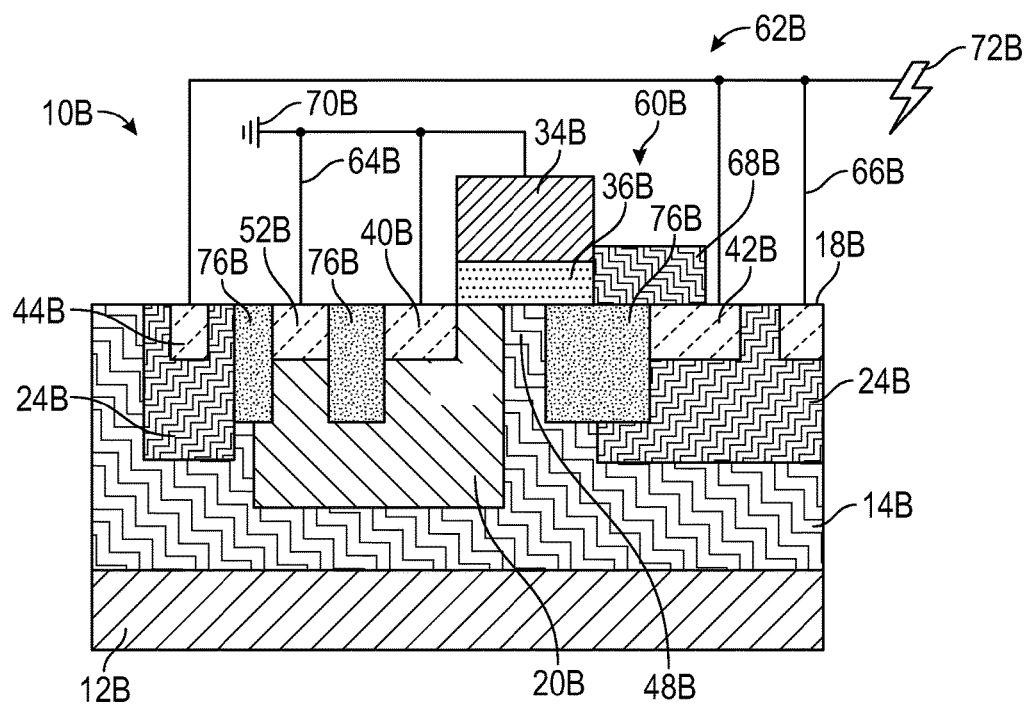
Figure 11:
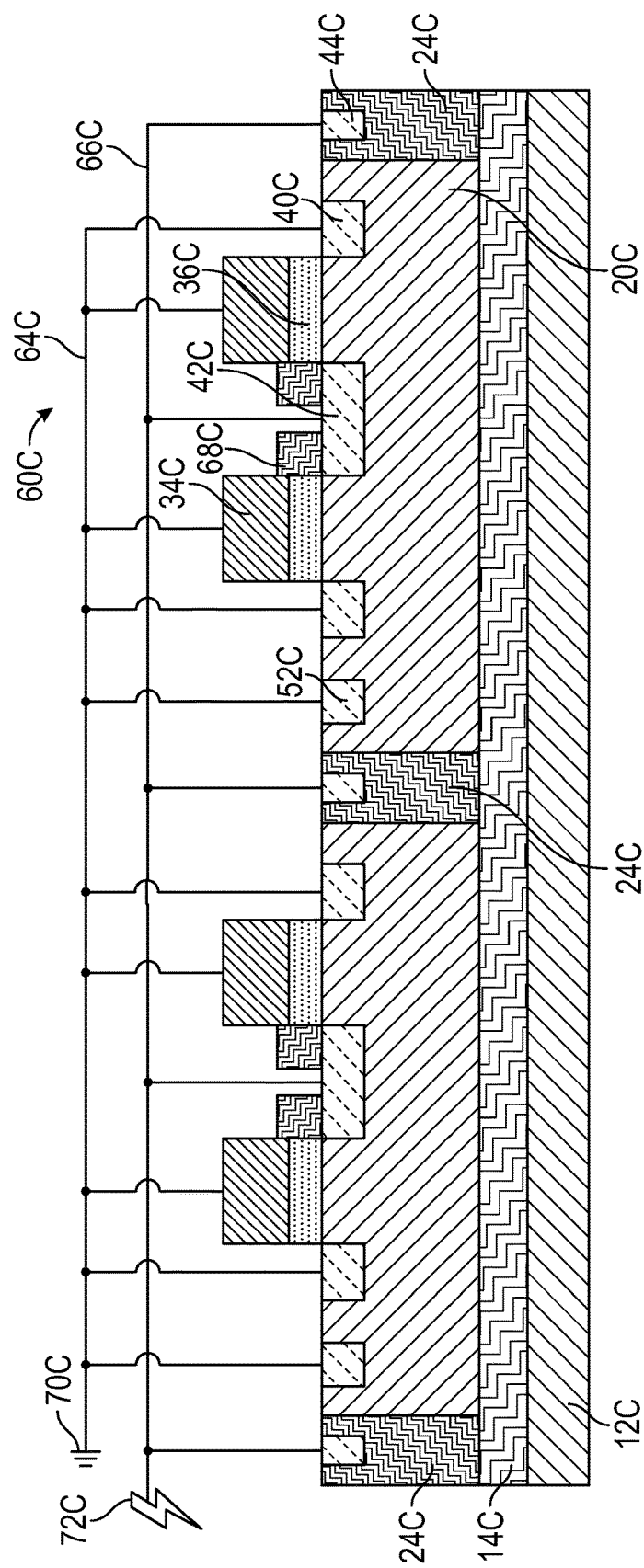

Reference is made to FIGS. 9, 10, and 11, with continuing reference to FIGS. 7 and 8. FIGS. 9, 10, and 11 illustrate alternate embodiments of the ESD transistor, where the components in FIGS. 9, 10, and 11 have the same reference numbers as used above except that the components in FIG. 9 are denoted by the letter "A" following the reference number, the components in FIG. 10 are denoted by the letter "B" following the reference number, and the components in FIG. 11 are denoted by the letter "C" following the reference number. The embodiments illustrated in FIGS. 9 and 10 include shallow trench isolation structures 76A, 76B, which are electrical insulators, where these shallow trench isolation structures 76A, 76B are formed using known techniques. The embodiments in FIGS. 9 and 10 represent ESD transistor designs that may be able to withstand higher voltage ranges than the embodiment illustrated in FIGS. 7 and 8. The trigger voltage of the ESD transistor 60 can be adjusted within a range, as explained below, but the range has limits for a single design. For example, the ESD transistor design illustrated in FIGS. 7 and 8 may be utilized for a voltage range of from about 5 volts to about 20 volts, the design illustrated in FIG. 9 may be used for a voltage range of from about 10 to about 40 volts, and the design illustrated in FIG. 10 may be used for a voltage range of from about 25 to about 100 volts. Other voltage ranges are possible in alternate embodiments, and other designs may also be utilized for similar or for different voltage ranges. The different ESD transistor designs illustrated in FIGS. 7, 9, and 10 may have different ranges for the trigger voltage, so a limited number of ESD transistor designs can be utilized to provide a very wide range of trigger voltages for different electronic device purposes. Simply changing the gate width 74 allows for different trigger and holding voltages from comparably configured ESD transistors 60, and this simplifies the design and manufacturing process for electronic devices 10. The embodiment in FIG. 11 illustrates two gates 34C and two sources 40C in associated with a single drain 42C, all of which are in a single P well 20C. The two gates 34C and two sources 40C act as two ESD transistors 60C that are typically connected in parallel. The illustrated embodiment includes two such P wells 20C for a total of 4 ESD transistors 60C.

Figure 12:
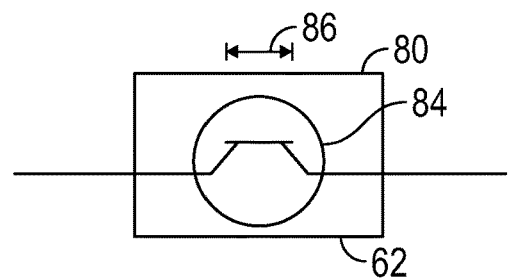
FIGS. 12-15 illustrate schematic drawings of portions of an electronic device.
Figure 13:
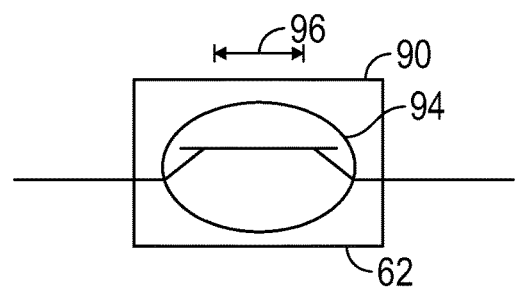

Referring to an exemplary embodiment illustrated in FIGS. 12 and 13, with continuing reference to FIGS. 7 and 8, an electronic device 10 includes a first ESD circuit 80 that includes a first ESD transistor 84. (Note: The first, second, and third ESD circuits 80, 90, 100 and related first and second components described herein are specific examples of the more general term ESD circuit 62 and related components described above.) The first ESD transistor 84 has a first gate width 86, where the first gate width 86 is schematically represented by the top flat line within the transistor figure. The first ESD transistor 84 has a first trigger voltage. The electronic device 10 also includes a second ESD circuit 90 that includes a second ESD transistor 94. The second ESD transistor 94 has a second gate width 96 that is different than the first gate width 86, so the second ESD transistor 94 has a second trigger voltage that is different than the first trigger voltage. In an exemplary embodiment, the second trigger voltage is about 0.5 volts or more different than the first trigger voltage. The first and second ESD transistors 84, 94 include comparable components that are comparably configured with the exception that the first gate width 86 is different than the second gate width 96 (and associated components have dimensions to suit the different gate widths.) In the embodiment illustrated in FIGS. 12 and 13, the second gate width 96 is longer than the first gate width 86, and as a result the second trigger voltage is lower than the first trigger voltage, but in alternate embodiments the first gate width 86 is longer than the second gate width 96.

Figure 14:
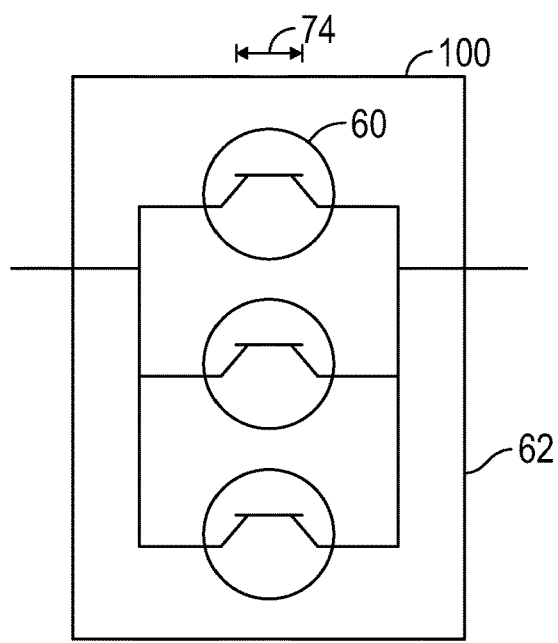

Referring to an exemplary embodiment in FIG. 14, with continuing reference to FIGS. 7, 8, and 12, a third ESD circuit 100 includes a plurality of ESD transistors 60 connected in parallel. Each ESD transistor 60 represents a single "finger" of the ESD circuit 100, and the number of fingers is varied to meet design requirements, where the number of fingers can vary significantly. All the ESD transistors 60 in the third ESD circuit 10 and the first ESD transistor 86 include comparable components that are comparably configured, where the all the ESD transistors 60 in the third ESD circuit 100 have about the same gate width 74 as the first gate width 86. In the illustrated exemplary embodiment, the first ESD circuit 80 includes a single first ESD transistor 84. As a result, the third ESD circuit 100 and the first ESD circuit 80 have about the same trigger voltage because all the ESD transistors 60 have about the same gate width 74, despite the fact that the third ESD circuit 100 includes more ESD transistors 60 than the first ESD circuit 80. The third ESD circuit 100 is capable of transferring more current than the first ESD circuit 80 due to the larger number of about identical ESD transistors 60 (or fingers), but the trigger voltage of the first and third ESD circuits 80, 100 are about the same. This comparison demonstrates that the trigger voltage is independent of the number of ESD transistors 60 in a circuit.

Figure 15:
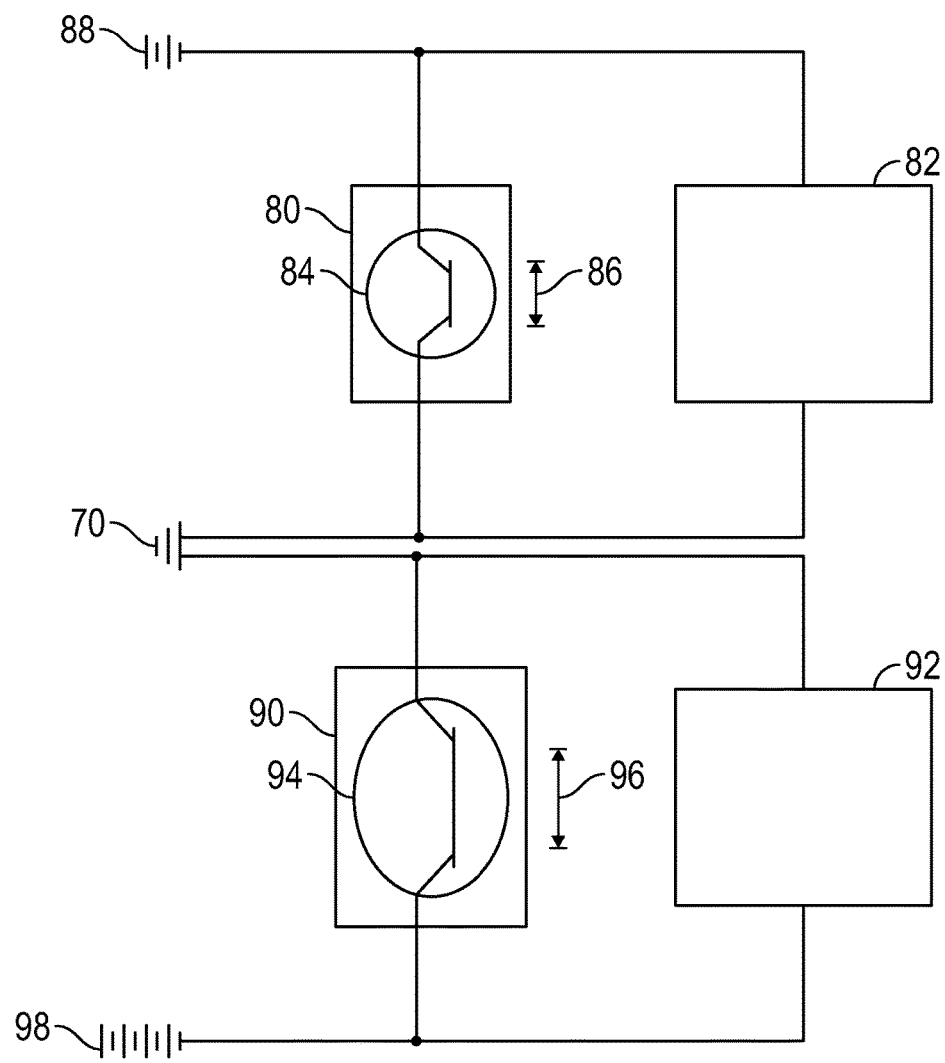

Reference is made to an exemplary embodiment illustrated in FIG. 15, with continuing reference to FIGS. 7, 8, 12, and 13. An electronic device 10 includes the first and second ESD circuits 80, 90, a first protected circuit 82, and a second protected circuit 92. The first ESD circuit 80 is configured to discharge an electrostatic discharge (ESD) to the ground 70 such that the ESD bypasses the first protected circuit 82. In other words, the first ESD circuit 80 is configured to protect the first protected circuit 82 from an ESD. The first ESD circuit 80 and the first protected circuit 82 are in electrical communication with a first I/O port 88 and with a ground 70. In a similar manner, the second ESD circuit 90 is configured to discharge an ESD to the ground 70 such that the ESD bypasses the second protected circuit 92. The second ESCD circuit 90 and the second protected circuit 92 are in electrical communication with a second I/O port 98 and with a ground 70 (which may or may not be the same ground 70 electrically connected to the first ESD circuit in various embodiments), where the first and second I/O ports 88, 98 provide different voltages. As discussed above, the first and second gate widths 86, 96 and the first and second trigger voltages are different. Also, as discussed above, the first and second ESD transistor 84, 94 have comparable components that are comparably configured, with the exception that the first and second gate widths 86, 96 are different. The embodiment illustrated in FIGS. 12, 13 and 15 illustrate how a single design for an ESD transistor 86, 96 can be adjusted to provide a plurality of different desired trigger voltages so the same design can be used for different types of protected circuits 82, 92.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an electronic device comprising:
   forming a protected circuit;
   forming an ESD circuit configured to discharge an electrostatic discharge (ESD) to a ground such that the ESD bypasses the protected circuit;
   forming an ESD transistor in the ESD circuit, wherein the ESD transistor comprises a source and a drain, wherein the ESD transistor comprises a gate comprising a gate width perpendicular to a gate length, wherein the gate length is measured across the gate from the source to the drain, and wherein a trigger voltage of the ESD transistor is set by adjusting the gate width; and wherein
   forming the ESD transistor in the ESD circuit comprises forming a plurality of ESD transistors in the ESD circuit, wherein the plurality of ESD transistors in the ESD circuit are connected in parallel, and wherein the trigger voltage is independent of the number of ESD transistors in the ESD circuit.

2. The method of claim 1 wherein:
   forming the ESD transistor comprises forming a deep N well underlying the gate, the source, and the drain; and electrically connecting the drain to the deep N well.

3. The method of claim 2 further comprising:
   forming a connecting well that directly contacts the deep N well, wherein the connecting well forms a ring around the source and the drain.

4. The method of claim 2 further comprising:
   forming a P well underlying the gate, the source, and the drain, wherein the P well overlies the deep N well.

5. The method of claim 2 further comprising:
   forming a connecting well primarily comprising "N" type conductivity determining impurities, wherein the connecting well is in electrical communication with the deep N well and wherein the connecting well is in electrical communication with the drain.

6. The method of claim 2 further comprising:
   forming a drain interconnect, wherein the drain interconnect is in electrical communication with the drain and with the deep N well.

7. The method of claim 1 wherein:
   forming the protected circuit comprises forming a first protected circuit and second protected circuit; and
   forming the ESD circuit comprises forming a first ESD circuit comprising a first ESD transistor with a first gate width, wherein the first ESD circuit is configured to discharge the ESD to the ground to bypass the first protected circuit, and forming a second ESD circuit comprising a second ESD transistor with a second gate width, wherein the second ESD circuit is configured to discharge the ESD to the ground to bypass the second protected circuit, wherein the first ESD transistor and the second ESD transistor are formed with comparable components that are comparably configured with the exception that the first gate width is different than the second gate width, and wherein the first ESD transistor and the second ESD transistor have different trigger voltages.

8. The method of claim 7 wherein forming the ESD circuit comprises forming the first gate width shorter than the second gate width, wherein the first ESD transistor has a higher trigger voltage than the second ESD transistor.

9. The method of claim 1 wherein:
   forming the ESD transistor comprises forming the source and the drain wherein the source and the drain comprise conductivity determining impurities that are primarily "N" type conductivity determining impurities; the method further comprising
   forming a P well underlying the source, the drain, and the gate, wherein the P well comprises conductivity determining impurities that are primarily "P" type conductivity determining impurities; and
   forming a deep N well underlying the P well, wherein the deep N well comprises conductivity determining impurities that are primarily "N" type conductivity determining impurities.

10. The method of claim 9 further comprising:
    forming a connecting well in electrical communication with the deep N well and the drain, wherein the connecting well comprises conductivity determining impurities that are primarily "N" type conductivity determining impurities; and wherein
    forming the ESD transistor comprises forming the P well in direct contact with the deep N well, the source, the drain, and the connecting well.

11. The method of claim 9 further comprising:
    forming a base contact primarily comprising conductivity determining impurities that are primarily "P" type conductivity determining impurities, wherein the base contact is in electrical communication with the P well; and forming a source interconnect in electrical communication with the base contact, the gate, and the source.

12. The method of claim 11 further comprising:

forming a drain interconnect in electrical communication with the drain, wherein the drain interconnect is also in electrical communication with the deep N well.

13. The method of claim 1 wherein:

forming the ESD transistor comprises;

forming the source and the drain within a substrate; and forming the gate overlying the substrate;

the method further comprising forming a deep N well in the substrate underlying the source and the drain; and forming a P well in the substrate overlying the deep N well and underlying the source and the drain.

14. A method of producing an electronic device comprising:

forming an ESD transistor comprising a source, a drain, and a gate between the source and the drain, wherein forming the ESD transistor comprises forming a first ESD transistor and a second ESD transistor, wherein the first ESD transistor comprises a first gate width, wherein the second ESD transistor comprises a second gate width that is different than the first gate width, wherein the first ESD transistor and the second ESD transistor comprise the same components that are configured in the same way with the exception that the first gate width is different than the second gate width, and wherein the first ESD transistor has a different trigger voltage than the second ESD transistor;

forming a P well underlying the source, the drain and the gate;

forming a deep N well underlying the P well;

forming a source interconnect in electrical communication with the gate, the source, and the base contact; and forming a drain interconnect in electrical communication with the drain and the deep N well.

15. The method of claim 14 further comprising:

forming a protected circuit; and forming an ESD circuit comprising the ESD transistor, wherein the ESD circuit is configured to discharge an electrostatic discharge (ESD) to a ground such that the ESD bypasses the protected circuit.

16. The method of claim 14 further comprising:

forming a connecting well in electrical communication with the drain and with the deep N well.

17. The method of claim 16 wherein forming the connecting well comprises forming the connecting well in a ring that encompasses the source and the drain.

18. An electronic device comprising:

a first protected circuit of the electronic device;

a second protected circuit of the electronic device;

a first ESD circuit configured to discharge an electrostatic discharge (ESD) to a ground to bypass the first protected circuit, wherein the first ESD circuit comprises a first ESD transistor, wherein the first ESD transistor comprises a first gate width, wherein the first ESD transistor has a first trigger voltage; and a second ESD circuit configured to discharge the ESD to the ground to bypass the second protected circuit, wherein the second ESD circuit comprises a second ESD transistor, wherein the second ESD transistor comprises a second gate width different than the first gate width, wherein the first ESD transistor and the second ESD transistor comprise comparable components that are comparably configured with the exception that the first gate width is different than the second gate width, and wherein the second ESD transistor comprises a second trigger voltage different than the first trigger voltage.

* * * * *